United States Patent
Amoah et al.

(10) Patent No.: US 8,637,403 B2
(45) Date of Patent: Jan. 28, 2014

(54) LOCALLY TAILORING CHEMICAL MECHANICAL POLISHING (CMP) POLISH RATE FOR DIELECTRICS

(75) Inventors: Yoba Amoah, Fairfax, VT (US); Graham M. Bates, Waterbury, VT (US); Joseph P. Hasselbach, Burlington, VT (US); Thomas L. McDevitt, Underhill, VT (US); Eva A. Shah, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/323,093

(22) Filed: Dec. 12, 2011

(65) Prior Publication Data

US 2013/0147067 A1 Jun. 13, 2013

(51) Int. Cl.
*H01L 21/302* (2006.01)
*H01L 21/461* (2006.01)

(52) U.S. Cl.
USPC .............. 438/692; 257/E21.214; 257/E21.23; 257/E21.232; 257/E21.244; 257/E21.277; 438/626; 438/637; 438/705; 438/788

(58) Field of Classification Search
USPC ...................... 257/E21.214, E21.23, E21.232, 257/E21.244, E21.277; 438/626, 637, 692, 438/705, 788
See application file for complete search history.

(56) References Cited

U.S. PATENT DOCUMENTS

| | | | |
|---|---|---|---|
| 6,291,360 B1 | 9/2001 | Moon | |
| 6,734,096 B2 | 5/2004 | Dalton et al. | |
| 6,858,153 B2 | 2/2005 | Bjorkman et al. | |
| 6,962,869 B1 | 11/2005 | Bao et al. | |
| 7,049,209 B1 | 5/2006 | Dalton et al. | |
| 7,253,105 B2 | 8/2007 | Dimitrakopoulos et al. | |
| 7,572,732 B2 | 8/2009 | Goodner et al. | |
| 2003/0139051 A1* | 7/2003 | Andideh et al. | 438/692 |
| 2003/0183252 A1 | 10/2003 | Timperio et al. | |
| 2004/0152342 A1* | 8/2004 | Li et al. | 438/789 |
| 2004/0155341 A1* | 8/2004 | Pipes et al. | 257/751 |
| 2004/0219757 A1 | 11/2004 | Olewine et al. | |
| 2008/0149884 A1 | 6/2008 | Siddiqui et al. | |
| 2011/0215409 A1 | 9/2011 | Li et al. | |

FOREIGN PATENT DOCUMENTS

TW 346648 A 12/1998

OTHER PUBLICATIONS

Wang, Y. et al., "Modeling the effects of abrasive size, surface oxidizer concentration and binding energy on chemical mechanical polishing at molecular scale",Tribology International, Jan. 1, 2008, pp. 202-210.

Borst, C.L. et al., "Chemical-mechanical polishing of SiOC organosilicate glasses: the effect of film carbon content", Thin Solid Films, vol. 385, No. 1-2, Apr. 2, 2001, pp. 281-292.

* cited by examiner

*Primary Examiner* — Asok K Sarkar

(74) *Attorney, Agent, or Firm* — Michael LeStrange; Roberts Mlotkowski Safran & Cole, P.C.

(57) ABSTRACT

A method of manufacturing a semiconductor structure includes varying local chemical mechanical polishing (CMP) abrading rates of an insulator film by selectively varying a carbon content of the insulator film.

20 Claims, 7 Drawing Sheets

LOCALLY TAILORING CHEMICAL MECHANICAL POLISHING (CMP) POLISH RATE FOR DIELECTRICS

FIELD OF THE INVENTION

The invention relates to semiconductor structures and methods of manufacture and, more particularly, to locally tailoring a chemical mechanical polishing (CMP) polish rate for dielectric materials.

BACKGROUND

Chemical mechanical polishing (CMP) is a common technique used in planarization of films during fabrication of integrated circuit (IC) chips. CMP includes rotating a pad in a slurry including abrasives to planarize a surface and/or define conductive interconnect patterns of a wafer. However, a number of factors may result in the CMP process producing a non-planar surface. For example, it is common for sparsely populated areas (e.g., areas of a wiring level having a low pattern density of features such as wires, interconnects, etc.) to be overpolished during a CMP process, which can result in dishing of the layer being polished and/or damage to the layer beneath the layer being polished.

Accordingly, there exists a need in the art to overcome the deficiencies and limitations described hereinabove.

SUMMARY

In a first aspect of the invention, a method of forming a semiconductor structure comprises varying local chemical mechanical polishing (CMP) abrading rates of an insulator film by selectively varying a carbon content of the insulator film.

In another aspect of the invention, a method of forming a semiconductor structure comprises forming a mask on an insulator film to create a masked area and an unmasked area of the insulator film. The method also includes adjusting a chemical mechanical polishing (CMP) removal rate of the unmasked area by changing a carbon content of the unmasked area.

In yet another aspect of the invention, a semiconductor structure comprises a carbon doped insulator film on a wafer. A first predefined area of the insulator film comprises a first percentage of carbon and an associated first chemical mechanical polishing (CMP) removal rate. A second predefined area of the insulator film comprises a second percentage of carbon and an associated second CMP removal rate. The first percentage is less than the second percentage. The first CMP removal rate is greater than the second CMP removal rate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to locally tailoring a chemical mechanical polishing (CMP) polish rate for dielectric materials. In accordance with aspects of the invention, the CMP removal rate of a particular area of a dielectric material is adjusted by changing the carbon content of the dielectric material in the particular area. In embodiments, a mask is applied to an insulator film to be polished using CMP. The mask is patterned to expose areas of the insulator film. The carbon content of the insulator film at the exposed areas is adjusted, e.g., changed relative to the unexposed areas of the insulator film. Adjusting the carbon content of the exposed areas of the insulator film changes the CMP removal rate of the exposed areas of the insulator film relative to the unexposed areas of the insulator film. In this manner, the CMP removal rates of different areas of an insulator film may be selectively tailored to increase or decrease the polish rate, which can advantageously be used to avoid over-polishing and/or dishing during the CMP process.

Figure 1:
FIGS. 1-3 show a non-uniform CMP process.
Figure 2:
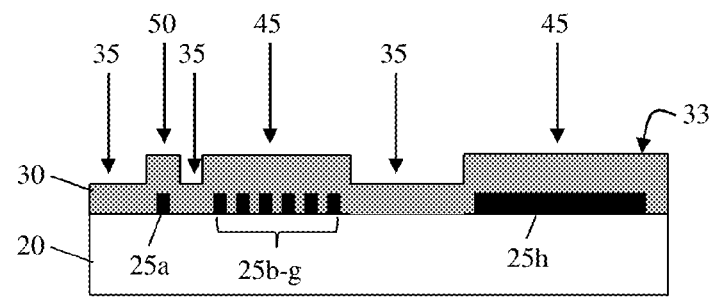
Figure 3:
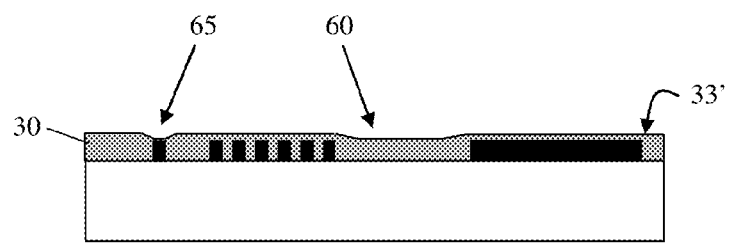

FIGS. 1-3 show a non-uniform CMP process resulting in a non-planar upper surface of a film that has been polished by CMP. In particular, FIG. 1 shows a semiconductor structure comprising a layer of electrically insulating material 20. The layer 20 may comprise, for example, a substrate of an IC chip or a layer of insulator formed on and over a substrate to produce one of many wiring levels of the IC chip. The layer 20 may be composed of any suitable insulator material, and may be formed using conventional semiconductor manufacturing techniques.

Still referring to FIG. 1, features 25*a-h* are formed on the layer 20. The features 25*a-h* may comprise electrically conductive features such as, for example, wires, interconnects, resistors, etc., e.g., as are commonly provided in wiring levels of a layered IC chip. The features 25*a-h* may additionally or alternatively comprise electrical insulator features, such as spacers, isolation regions, etc. The features 25*a-h* may be composed of any suitable material or combination of materials, and may be formed using conventional semiconductor manufacturing techniques.

FIG. 2 shows an insulating film 30 formed over the layer 20 and features 25*a-h*. The film 30 may be composed of any suitable insulator material and may be formed using conventional semiconductor manufacturing techniques. For example, the film 30 may comprise an interlevel dielectric (ILD) formed by a conformal (e.g., blanket) deposition process. In accordance with aspects of the present invention, the film 30 comprises carbon doped oxide and, in particular, carbon doped $SiO_2$ (SiCOH).

As depicted in FIG. 2, the upper surface 33 of film 30 is not planar. Instead, areas of the film 30 that are not located over any features (e.g., 25*a-h*) have a relatively lower upper surface, which is referred to herein as a down area 35. On the other hand, areas of the film 30 that are located over features 25*a-h* have a relatively higher upper surface, which is referred to herein as an up area 45, 50. This difference in height of the upper surface 33 of the film 30 is due to the conformal deposition of the film 30 over the uneven surface produced by the combination of the layer 20 and features 25*a-h*.

Still referring to FIG. 2, it can be seen that large features, such as wide feature 25*h*, and pluralities of features having high pattern densities, such as nested lines 25*b-g*, produce relatively large up areas 45. On the other hand, features arranged in areas of low pattern density, such as feature 25*a*, produce relatively small up areas 50.

FIG. 3 shows the structure after a CMP process has been preformed. As depicted in FIG. 3, the new upper surface 33' of the film 30 is not planar, but rather exhibits dishing 60 and over-polishing 65. The dishing 60 occurs at areas corresponding to the down areas 35 described with respect to FIG. 2. The over-polishing 65 occurs at areas corresponding to the small up areas 50 described with respect to FIG. 2. Such dishing and over-polishing can occur as a result of various pattern densities affecting the CMP removal rate at localized areas.

Figure 4:
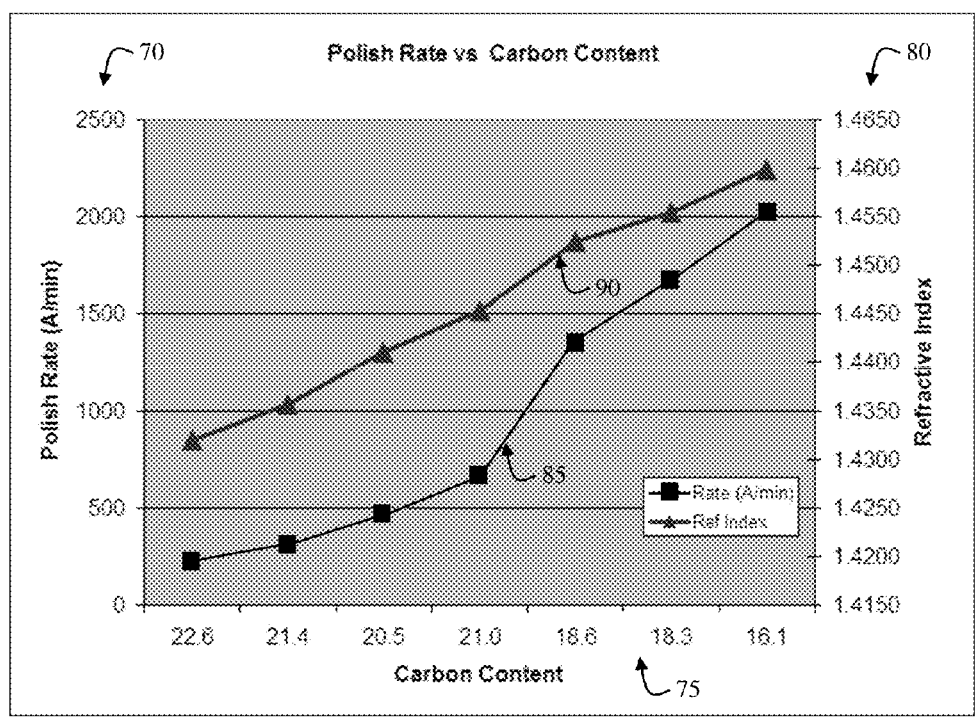
FIG. 4 shows a data plot of CMP removal rate versus carbon content in accordance with aspects of the invention.

FIG. 4 shows a data plot of CMP removal rate versus carbon content according to aspects of the invention. The left-side vertical axis 70 shows CMP polish rate (also referred to as a CMP removal rate and/or a CMP abrading rate) in Angstroms/minute. The horizontal axis 75 shows carbon content (e.g., atomic %) of a SiCOH film (e.g., film 30). The right-side vertical axis 80 shows the Refractive Index. Line 85 is data showing the change in CMP removal rate for SiCOH film as the carbon content of the SiCOH film changes. Line 90 is data showing the change in Refractive Index as the carbon content of the SiCOH film changes. As shown in FIG. 4, changing the carbon content in the SiCOH film by about 4% to 6% (e.g., from a nominal amount of about 22% carbon to about 16% carbon) produces a change of about 10 times the CMP polish rate (e.g., from about 200 Å/min to about 2000 Å/min). Implementations of the invention utilize this phenomenon to selectively tailor the CMP removal rate of localized areas of a SiCOH film (e.g., film 30) across a wafer surface by adjusting the carbon content of the localized areas.

Figure 5:
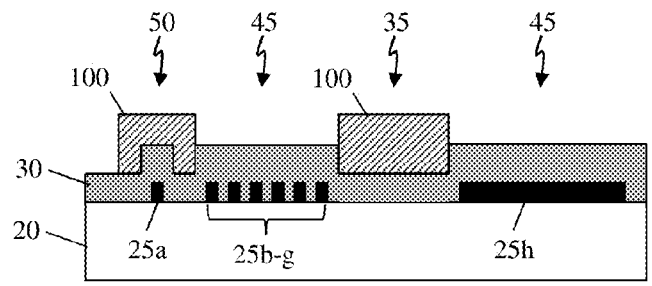
FIGS. 5-8 show processing steps and structures in accordance with additional aspects of the invention.

FIGS. 5-8 show processing steps and structures in accordance with aspects of the invention. Specifically, FIG. 5 shows the structure of FIG. 2 including layer 20, features 25*a-h*, and insulator film 30. In embodiments, the film 30 is a SiCOH film, e.g., is composed of carbon-doped $SiO_2$. As shown in FIG. 5, a resist mask 100 is formed over portions of the film 30. The resist mask 100 may be composed of suitable materials and formed according to conventional semiconductor processing techniques. For example, the resist mask 100 may be formed by depositing a layer of photoresist material on the film 30, exposing the photoresist material to a pattern of light, and developing (e.g., removing) unexposed portions of the photoresist material, such that the resist mask 100 is left after the developing step.

According to aspects of the invention, the resist mask 100 is formed on areas of the film 30 where it is desired to have a relatively low CMP removal rate (e.g., slower material removal during the CMP process), and the resist mask 100 is not formed over areas of the film 30 where it is desired to have a relatively high CMP removal rate (e.g., faster material removal during the CMP process). As shown in FIG. 5, the resist mask 100 is formed on the small up area 50 and down area 35; whereas, the resist mask 100 is not formed on large up areas 45. Stated differently, the mask 100 may be patterned such that a masked area is associated with a low pattern density area under the insulator film, and an unmasked area is associated with a high pattern density area under the insulator film.

Figure 6:
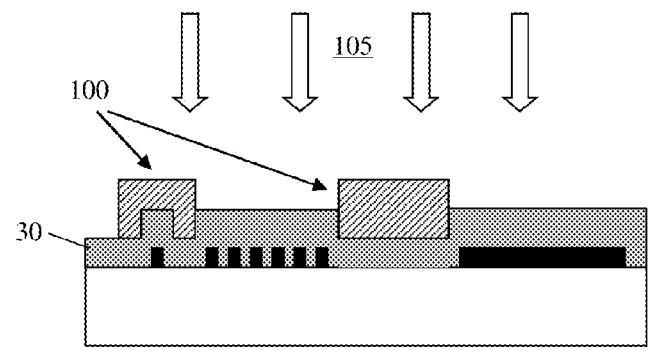

FIG. 6 depicts a step of reducing the carbon content of the film 30 at unmasked areas of the film 30, e.g., at areas of the film 30 that are not covered by the resist mask 100. In embodiments, the carbon reduction step comprises using an oxidizing plasma, depicted generally as arrows 105, to draw carbon atoms out of exposed (e.g., uncovered) areas of the film 30. For example, the wafer containing the film 30 and resist mask 100 may be placed in either an etch chamber or an ash chamber of a plasma etcher or a plasma asher, and $O_2$ gas may be flowed in the chamber at sufficient process parameters to form an oxygen plasma in the chamber. The oxygen plasma in the chamber attracts carbon atoms out of the film 30, thereby decreasing the carbon content of the film 30 at areas of the film 30 that are not covered by the resist mask 100. The resist mask 100 on the film 30 blocks specific areas of the film 30 from exposure to the oxidizing ambient atmosphere within the chamber.

Figure 7:
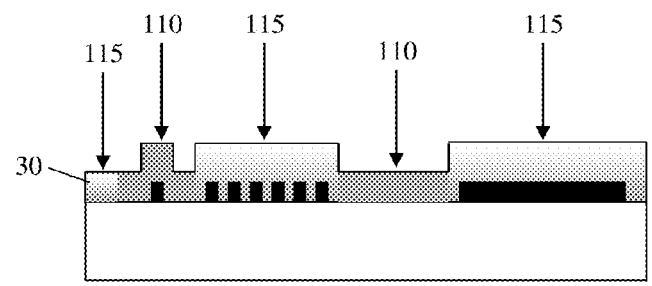

As shown in FIG. 7, the resist mask 100 is removed from the film 30. In embodiments, the resist mask 100 may be removed by: in-situ during the $O_2$ ash treatment (e.g., the oxidizing plasma completely consumes the resist mask 100 during the carbon reduction step); in a second plasma treatment, such as an $N_2$:$H_2$ plasma stripping process; or using a solvent such as a wet bath of sulfuric peroxide or other suitable solvent.

Figure 8:
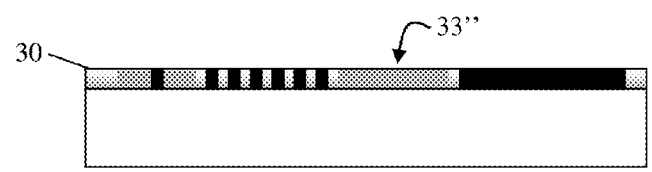

As depicted in FIG. 7, areas 110 of the film 30 that were covered by the resist mask contain the nominal (e.g., starting) atomic % of carbon, e.g., undepleted C in SiCOH. On the other hand, areas 115 of the film 30 that were not covered by the resist mask contain less than the nominal atomic % of carbon, e.g., C depleted SiCOH. In accordance with the data described with respect to FIG. 4, the undepleted areas 110 exhibit a slower CMP removal rate compared to the depleted areas 115. Accordingly, when a CMP process is performed on the modified film 30, as depicted in FIG. 8, the resultant upper surface 33" of the film 30 is substantially planar without exhibiting dishing and/or over-polishing.

Figure 9:
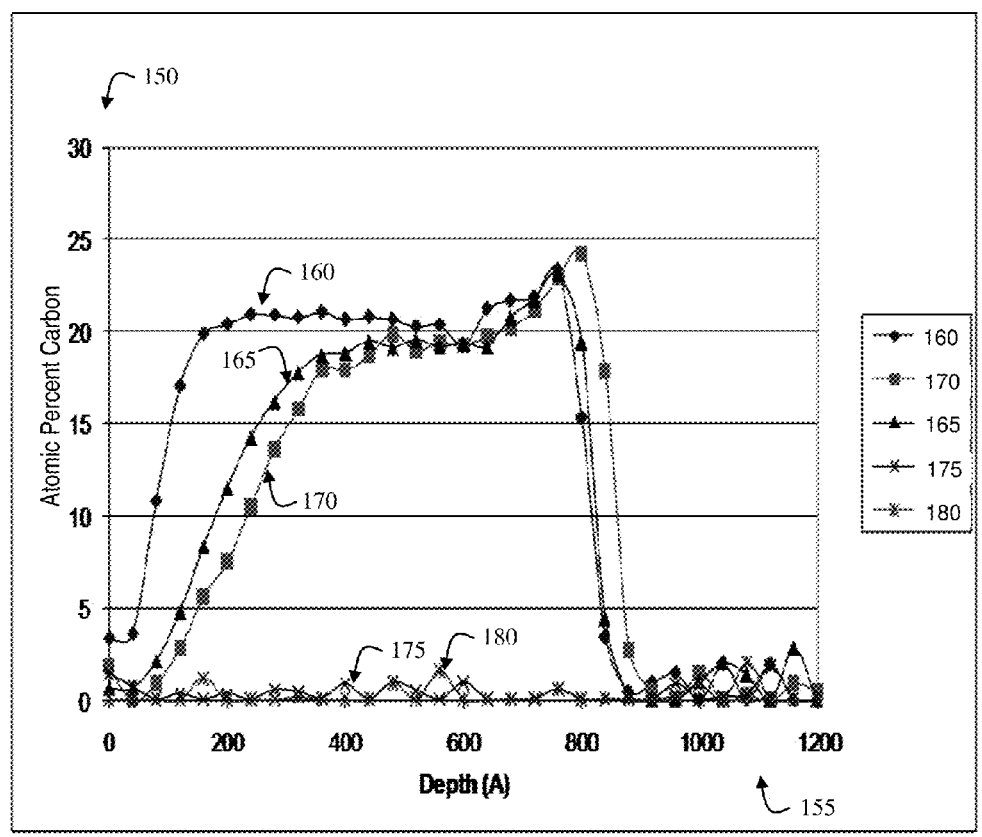
FIG. 9 shows a data plot of carbon depletion in accordance with aspects of the invention.

FIG. 9 shows a data plot of carbon depletion in accordance with aspects of the invention. In particular, FIG. 9 shows data corresponding to four exemplary implementations of a carbon reduction step such as that described with respect to FIG. 6. The vertical axis 150 shows atomic percent of carbon in a SiCOH film (e.g., film 30). The horizontal axis 155 shows depth into the SiCOH film in Angstroms, e.g., measured from the upper surface of the SiCOH film.

In FIG. 9, line 160 represents the carbon content versus depth of the SiCOH film as initially deposited, e.g., without having undergone any carbon reduction. Line 165 represents the carbon content versus depth of the SiCOH film after exposure to an oxygen plasma in an etch chamber with the following process parameters: $O_2$ flow rate of 500 sccm for two minutes at about 25° C., shower head power of 1200 W, and wafer power of 200 W. Line 170 represents the carbon content versus depth of the SiCOH film after exposure to an oxygen plasma in an etch chamber with the following process parameters: $O_2$ flow rate of 500 sccm for two minutes at about 25° C., shower head power of 800 W, and wafer power of 200 W. Line 175 represents the carbon content versus depth of the SiCOH film after exposure to an oxygen plasma in an ash chamber (e.g., resist strip chamber) with the following process parameters: $O_2$ flow rate of 2000 sccm for ten minutes at a wafer temperature of about 320° C. Line 180 represents the carbon content versus depth of the SiCOH film after exposure to an oxygen plasma in an ash chamber (e.g., resist strip chamber) with the following process parameters: $O_2$ flow rate of 2000 sccm for five minutes at a wafer temperature of about 320° C.

As depicted in FIG. 9, performing the carbon reduction step in the etch chamber (e.g., lines 165 and 170) reduces the carbon content of the SiCOH film at the surface of the film (e.g., 0 Å to about 400 Å), but leaves the carbon content substantially unaffected at greater depths (e.g., greater than about 400 Å). Performing the carbon reduction step in the ash chamber (e.g., lines 175 and 185) substantially eliminates the carbon content through the entire depth of the SiCOH film. Accordingly, implementations of the present invention may utilize either process (e.g., performing the carbon reduction in an ash chamber or in an etch chamber), depending on the desired carbon content of the SiCOH film and/or the desired amount of carbon reduction. Moreover, the process parameters described with respect to lines 165, 170, 175, and 180 are merely exemplary, and other process parameters are contemplated within the scope of the invention to achieve any desired carbon content profile through the depth of the SiCOH film or other carbon containing insulating films.

Figure 10:
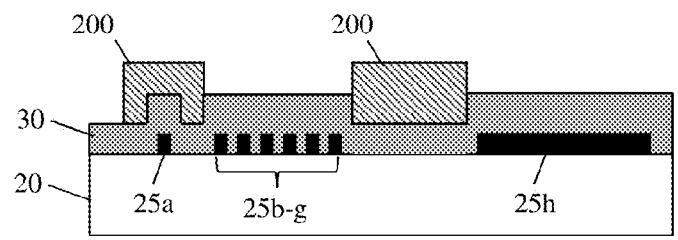
FIGS. 10-17 show processing steps and structures in accordance with additional aspects of the invention.

FIGS. 10-13 show processing steps and structures in accordance with additional aspects of the invention. Specifically, FIG. 10 shows the structure of FIG. 5 including layer 20, features 25a-h, and insulator film 30 (e.g., SiCOH film), but with a hard mask 200 instead of a resist mask (e.g., resist mask 100 as in FIG. 5). As described above with respect to FIG. 7, a resist mask is at least partially, and sometimes completely, consumed by an oxidizing plasma such as that used in the carbon reduction step in embodiments of the present invention. On the other hand, the hard mask 200 is not consumed by an oxidizing plasma. Accordingly, it may be desirable in some circumstances to use a hard mask 200 rather than a resist mask in implementations of the present invention.

In embodiments, the hard mask 200 is composed of any suitable hard mask material, including but not limited to polysilicon, titanium nitride, silicon nitride, etc. The hard mask 200 may be formed using conventional semiconductor processing techniques. For example, the hard mask 200 may be formed by depositing a hard mask material on the film 30, such as by chemical vapor deposition (CVD), and patterning the hard mask material using conventional photolithographic masking and etching processes.

Figure 11:
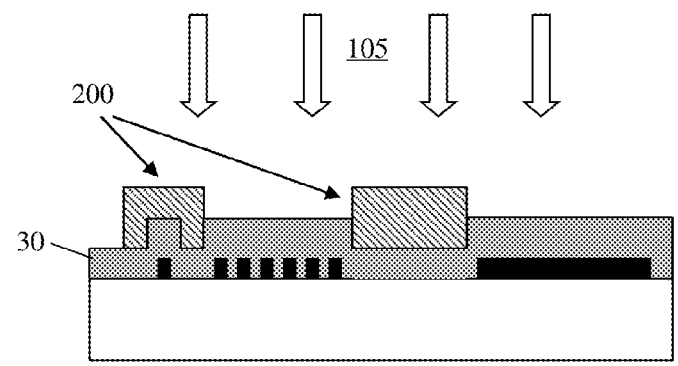

In implementations, the hard mask 200 is applied to the film 30 to block selected areas of the film 30 from exposure to an oxidizing plasma, e.g., in a manner similar to the resist mask 100 described with respect to FIG. 6. For example, FIG. 11 depicts a step of reducing the carbon content of the film 30 at unmasked areas of the film 30, e.g., at areas of the film 30 that are not covered by the hard mask 200. The process for performing the carbon reduction of the film 30 in FIG. 11 may be the same as that described with respect to FIG. 6, e.g., using an oxidizing plasma (shown generally at arrows 105) to extract carbon out of exposed portions of the film 30.

Figure 12:
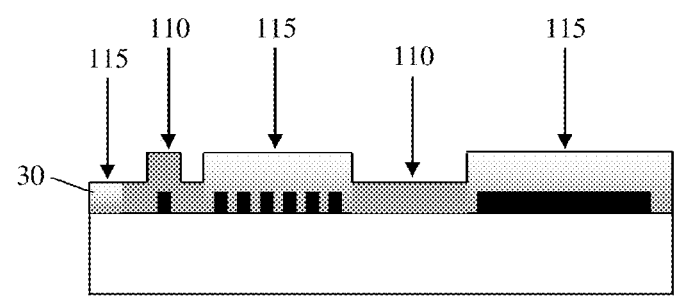

FIG. 12 shows removal of the hard mask 200. In embodiments, since the hard mask 200 is generally not consumed by the oxidizing plasma during the carbon reduction step, the hard mask may be removed using a suitable solvent. For example, a solution of isopropyl alcohol and potassium hydroxide may be used to strip a hard mask composed of polysilicon. Ammonium hydroxide may be used to strip hard mask composed of titanium nitride. Phosphoric acid may be used to strip hard mask composed of silicon nitride. However, it should be understood that any suitable solvents may be used to remove the hard mask within the scope of the invention. In the structure shown in FIG. 12, the undepleted areas 110 exhibit a slower CMP removal rate compared to the depleted areas 115 due to the localized adjusting of the carbon content of the film 30.

Figure 13:
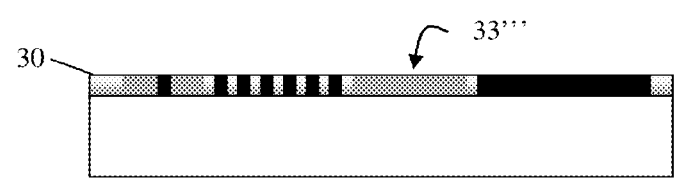

FIG. 13 shows the structure after a CMP process is performed on the modified film 30 after removal of the hard mask. The resultant upper surface 33''' of the film 30 is substantially planar without exhibiting dishing and/or over-polishing. As described above, a hard mask is substantially unaffected by an oxidizing plasma, such that using a hard mask provides the ability to keep the wafer in the plasma treatment for any desired amount of time, e.g., to achieve a particular amount of carbon reduction of the film 30. Depending on the depth of carbon reduction from the film 30, a carbon-depleted region of the film 30 may or may not remain after the CMP process.

Figure 14:
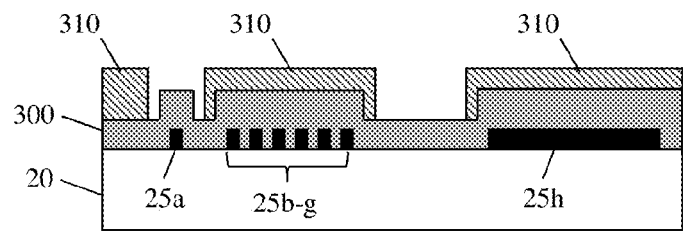

FIGS. 14-17 show processing steps and structures in accordance with additional aspects of the invention. Specifically, FIG. 14 shows a structure similar to that of FIG. 2 including layer 20, features 25a-h, but with film 300. In embodiments, the film 300 is initially a low or zero carbon content electrical insulating film, such as silicon oxide, and may be formed using conventional semiconductor processing techniques (e.g., CVD). Moreover, mask 310 selectively covers areas of the film 300 for the purpose of maintaining the initial low or zero carbon content in the masked areas. The mask 310 may comprise a resist mask or a hard mask, and may be formed using techniques already described herein.

Figure 15:
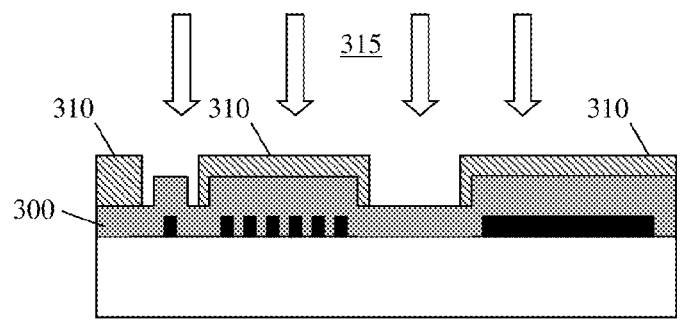

In particular, as shown in FIG. 15, carbon is implanted into the film 300 at unmasked areas of the film 300 (e.g., at areas not covered by the mask 310). The carbon implant is depicted generally at arrows 315 and may be performed in any suitable manner, such as ion-implantation and/or gas diffusion. In embodiments, the carbon implant is used to reduce the CMP removal rate of the film 300 at the unmasked areas by increasing the carbon content of the film 300 at the unmasked areas. For example, since the film 300 is initially a low or zero carbon content film with a relatively high CMP removal rate, the carbon implant may be used to reduce the CMP removal rate of the film at down areas and/or small up areas. Accordingly, the mask 310 may be patterned to cover large up areas while leaving down areas and small up areas exposed to the carbon implant.

Figure 16:
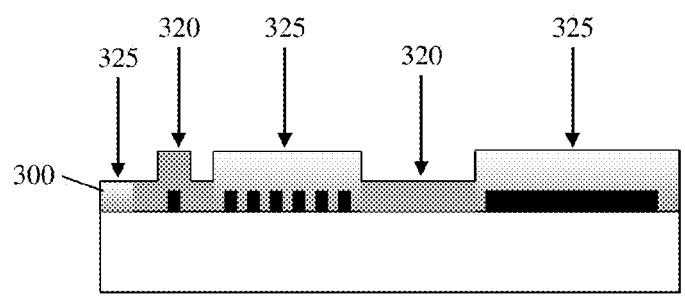
Figure 17:
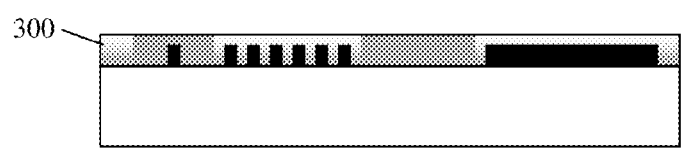

FIG. 16 shows removal of the mask 310 after the carbon implant. The mask 310 may comprise either a resist mask or a hard mask, and may be removed (e.g., stripped) from the film 300 using techniques already described herein. After removal of the mask, the film 300 contains relatively high carbon areas 320 and relatively low (or no) carbon areas 325. FIG. 17 shows the structure after a CMP process has been used to planarize the upper surface of the film 300.

As described herein, implementations of the invention provide the ability to locally tailor the CMP removal rate of an insulator material, e.g., dielectric film, such that some areas polish faster than others. In non-limiting examples, large up areas (e.g., over nested lines and/or wide features) may be tailored to polish relatively faster, small up areas may be tailored to polish relatively slower to suppress over-polish, and down areas may be tailored to polish relatively slower to suppress dishing or loss of planarity.

Implementations of the invention thus provide a reduction in over-burden of the insulator film and improved polish uniformity, which advantageously results in reduced per-wafer processing costs and process time savings. Implementations of the invention also provide for tighter process tolerances and relaxation of pattern-density design rule limitations.

Figure 18:
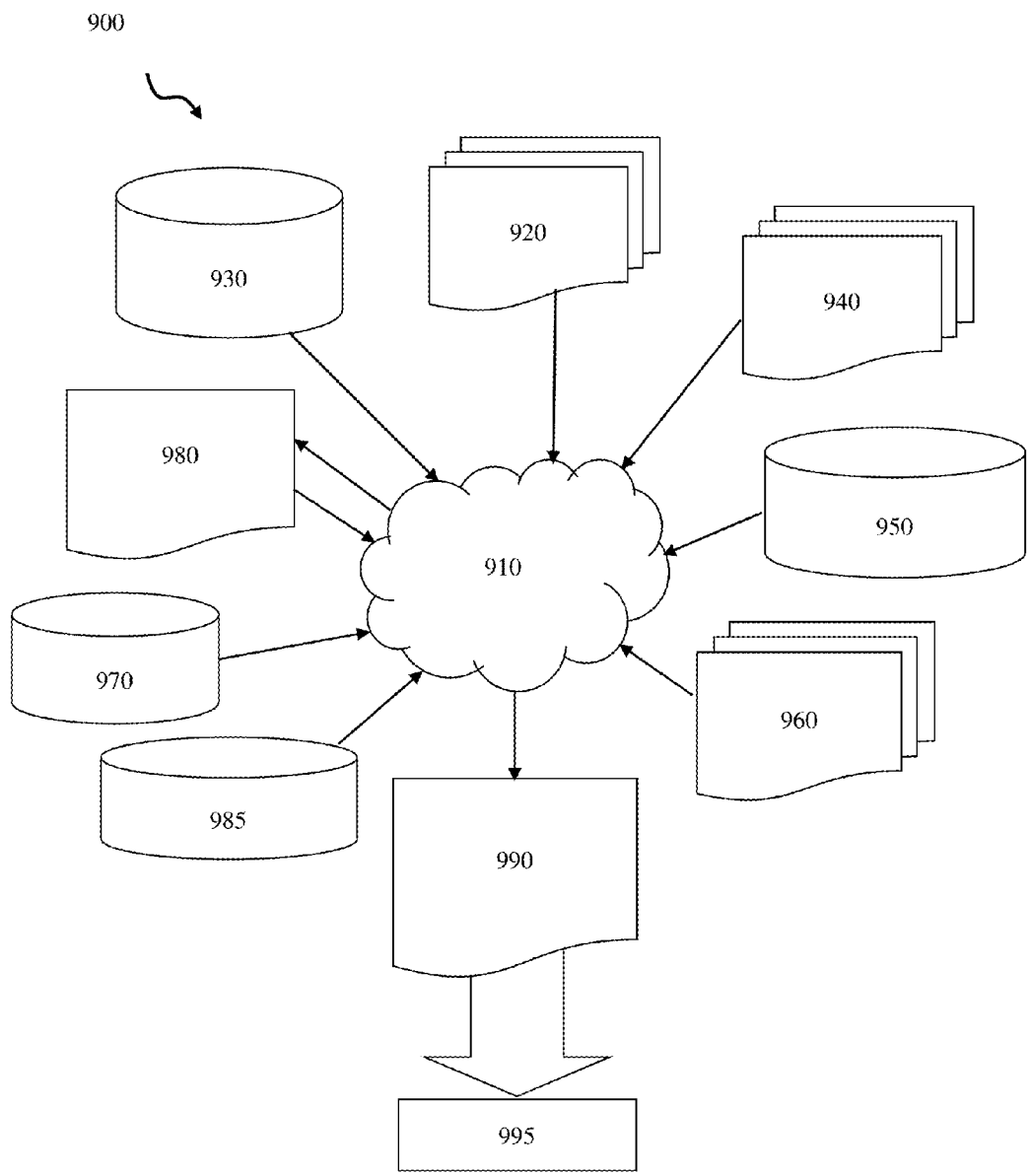
FIG. 18 is a flow diagram of a design process used in semiconductor design, manufacture, and/or test.

FIG. 18 is a flow diagram of a design process used in semiconductor design, manufacture, and/or test. FIG. 18 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3, 5-8, and 10-17. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3, 5-8, and 10-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3, 5-8, and 10-17 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3, 5-8, and 10-17. In one embodiment, design structure 990 may comprise a compiled, executable HDL simulation model that functionally simulates the devices shown in FIGS. 1-3, 5-8, and 10-17.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/ developer to produce a device or structure as described above and shown in FIGS. 1-3, 5-8, and 10-17. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

What is claimed:

1. A method of manufacturing a semiconductor structure, comprising:
    varying local chemical mechanical polishing (CMP) abrading rates of an insulator film by selectively varying a carbon content of the insulator film,
    wherein the selectively varying a carbon content of the insulator film comprises:
        forming a mask on the insulator film to block specific areas of the insulator film from exposure to an oxidizing ambient atmosphere;
        applying an oxidizing plasma to locally reduce carbon content from unmasked areas of the insulator film; and
        removing the mask.

2. The method of claim 1, wherein the forming the mask comprises forming a resist mask.

3. The method of claim 2, wherein the removing the mask comprises removing the mask in-situ using the oxidizing plasma.

4. The method of claim 2, wherein the removing the mask comprises an external plasma process after the oxidizing plasma.

5. The method of claim 2, wherein the removing the mask comprises applying solvent chemistry.

6. The method of claim 1, wherein the forming the mask comprises forming a hard mask.

7. The method of claim 1, wherein the oxidizing plasma is applied in an ash chamber of a plasma etcher or a plasma asher.

8. The method of claim 1, wherein the oxidizing plasma is applied in an etch chamber of a plasma etcher.

9. The method of claim 1, further comprising controlling a duration of the applying the oxidizing plasma to achieve carbon reduction to a particular depth of the insulator film.

10. The method of claim 1, wherein the insulator film comprises carbon doped silicon oxide, and further comprising performing a CMP process on the insulator film after the removing the mask to form a substantially planar upper surface of the insulator film.

11. The method of claim 1, wherein:
    the varying causes a first portion of the insulator film to have a different percentage of carbon than a second portion of the insulator film;
    the first portion corresponds to the unmasked areas of the insulator film;
    the second portion corresponds to masked areas of the insulator film.

12. The method of claim 11, further comprising:
    forming electrically conductive features on a top surface of an insulator layer; and
    forming the insulator film on and over the conductive features and the insulator layer,
    the masked areas are associated with low pattern density areas of the electrically conductive features under the insulator film; and
    the unmasked areas are associated with high pattern density areas of the electrically conductive features under the insulator film.

13. A method of manufacturing a semiconductor structure, comprising:
    forming a mask on an insulator film to create a masked area and an unmasked area of the insulator film; and
    adjusting a chemical mechanical polishing (CMP) removal rate of the unmasked area by changing a carbon content of the unmasked area.

14. The method of claim 13, wherein:
    the insulator film comprises carbon doped silicon oxide;
    the changing the carbon content comprises decreasing an amount of carbon in the unmasked area to increase the CMP removal rate at the unmasked area.

15. The method of claim 14, wherein the changing the carbon content comprises applying an oxidizing plasma to the unmasked area, and further comprising controlling a duration of the applying the oxidizing plasma to achieve carbon reduction to a particular depth of the insulator film.

16. The method of claim 14, wherein:
    the masked area is associated with a low pattern density area under the insulator film; and
    the unmasked area is associated with a high pattern density area under the insulator film.

17. The method of claim 13, wherein:
    the insulator film comprises silicon oxide;
    the changing the carbon content comprises increasing an amount of carbon in the unmasked area to decrease the CMP removal rate at the unmasked area.

18. The method of claim 17, wherein the changing the carbon content comprises implanting carbon into the unmasked area.

19. The method of claim 17, wherein:

the masked area is associated with a high pattern density area under the insulator film; and the unmasked area is associated with a low pattern density area under the insulator film.

20. The method of claim 13, wherein:

the changing the carbon content of the unmasked area results in: a first predefined area of the insulator film having a first percentage of carbon, and a second predefined area of the insulator film having a second percentage of carbon;

the first predefined area corresponds to the unmasked area;

the second predefined area corresponds to the masked area;

the first percentage of carbon is less than the second percentage of carbon; and the second percentage of carbon is a starting percentage of carbon of the insulator film.

\* \* \* \* \*